US012666990B2

(12) United States Patent
McDaniel et al.

(10) Patent No.: US 12,666,990 B2
(45) Date of Patent: Jun. 23, 2026

(54) CONNECTING SEMICONDUCTOR DIES THROUGH TRACES

(71) Applicant: Micron Technology, Inc., Boise, ID (US)

(72) Inventors: Terrence B. McDaniel, Boise, ID (US); Bret K. Street, Meridian, ID (US); Wei Zhou, Boise, ID (US); Kyle K. Kirby, Eagle, ID (US); Amy R. Griffin, Boise, ID (US); Thiagarajan Raman, Boise, ID (US); Jaekyu Song, Boise, ID (US)

(73) Assignee: Micron Technology, Inc., Boise, ID (US)

(*) Notice: Subject to any disclaimer, the term of this patent is extended or adjusted under 35 U.S.C. 154(b) by 743 days.

(21) Appl. No.: 17/938,917

(22) Filed: Sep. 6, 2022

(65) Prior Publication Data

US 2024/0079369 A1 Mar. 7, 2024

(51) Int. Cl.
*H10W 72/00* (2026.01)
*H10W 90/00* (2026.01)
*H10W 72/50* (2026.01)
*H10W 74/15* (2026.01)

(52) U.S. Cl.
CPC ....... *H10W 72/0198* (2026.01); *H10W 90/00* (2026.01); *H10W 72/07552* (2026.01); *H10W 72/07553* (2026.01); *H10W 72/521* (2026.01); *H10W 72/527* (2026.01); *H10W 72/531* (2026.01); *H10W 72/537* (2026.01); *H10W 74/15* (2026.01); *H10W 90/722* (2026.01);

*H10W 90/724* (2026.01); *H10W 90/734* (2026.01); *H10W 90/752* (2026.01)

(58) Field of Classification Search
CPC ......... H01L 24/48; H01L 24/16; H01L 24/32; H01L 24/49
See application file for complete search history.

(56) References Cited

U.S. PATENT DOCUMENTS 6,861,290 B1 * 3/2005 Moden .................... H05K 3/328
257/E21.511
7,009,296 B1 * 3/2006 Heo ..................... H10W 74/117
257/E25.023
(Continued)

FOREIGN PATENT DOCUMENTS

CN 109791925 A * 5/2019 ............ H10W 90/00
CN 117730634 A * 3/2024 .......... H10W 90/701
(Continued)

*Primary Examiner* — Laura M Menz
(74) *Attorney, Agent, or Firm* — Dorsey & Whitney LLP

(57) ABSTRACT

This document discloses techniques, apparatuses, and systems for connecting semiconductor dies through traces. A semiconductor assembly is described that includes two semiconductor dies. The first semiconductor die includes a first dielectric layer at which first circuitry is disposed. The second semiconductor die includes a second dielectric layer at which second circuitry is disposed. One or more traces extend from a side surface of the first dielectric layer and at a side surface of the second dielectric layer to electrically couple the first circuitry and the second circuitry. In doing so, rigid connective structures may not be needed to couple the first semiconductor die and the second semiconductor die.

14 Claims, 15 Drawing Sheets

(56) References Cited

U.S. PATENT DOCUMENTS

| | | | | |
|---|---|---|---|---|
| 7,745,920 | B2 * | 6/2010 | Lee | H10W 20/023 |
| | | | | 257/725 |
| 7,952,195 | B2 * | 5/2011 | Haba | H10W 90/00 |
| | | | | 257/E25.01 |
| 8,324,725 | B2 * | 12/2012 | Khandros | H10W 70/68 |
| | | | | 257/691 |
| 8,710,675 | B2 * | 4/2014 | Kim | H10W 74/111 |
| | | | | 438/666 |
| 8,723,332 | B2 * | 5/2014 | McElrea | H10W 70/60 |
| | | | | 257/777 |
| 9,029,196 | B2 * | 5/2015 | Pendse | H10W 74/117 |
| | | | | 257/737 |
| 9,379,084 | B2 * | 6/2016 | Pendse | H10W 74/117 |
| 9,899,286 | B2 * | 2/2018 | Pendse | H10W 74/117 |
| 9,917,041 | B1 * | 3/2018 | Runyan | H10W 90/811 |
| 10,312,219 | B2 * | 6/2019 | Ng | H10W 90/00 |
| 10,453,820 | B2 * | 10/2019 | Kinsley | H10W 76/15 |
| 10,978,426 | B2 * | 4/2021 | Kinsley | H10W 70/611 |
| 11,309,228 | B2 * | 4/2022 | Kim | H10W 40/22 |
| 11,309,281 | B2 * | 4/2022 | Tai | H10W 90/00 |
| 11,488,938 | B2 * | 11/2022 | Kinsley | H10W 70/611 |
| 11,538,762 | B2 * | 12/2022 | Chun | H10D 88/101 |
| 11,942,430 | B2 * | 3/2024 | Paek | H10W 70/65 |
| 12,362,313 | B2 * | 7/2025 | Baek | H10W 90/00 |
| 2004/0184226 | A1 * | 9/2004 | Hall | H10W 74/01 |
| | | | | 174/521 |
| 2005/0093117 | A1 * | 5/2005 | Masuda | H10W 74/016 |
| | | | | 257/E23.047 |
| 2005/0161796 | A1 * | 7/2005 | Wark | G11C 5/04 |
| | | | | 257/E21.705 |
| 2005/0167850 | A1 * | 8/2005 | Moden | H05K 3/328 |
| | | | | 257/784 |
| 2006/0267173 | A1 * | 11/2006 | Takiar | H10W 90/00 |
| | | | | 257/E25.013 |
| 2007/0069391 | A1 * | 3/2007 | Gritti | H10W 90/00 |
| | | | | 257/777 |
| 2008/0303131 | A1 * | 12/2008 | McElrea | H10W 70/60 |
| | | | | 257/E23.001 |
| 2010/0059897 | A1 * | 3/2010 | Fay | H10W 20/023 |
| | | | | 257/E23.141 |
| 2011/0037159 | A1 * | 2/2011 | McElrea | H10W 70/60 |
| | | | | 257/E23.141 |
| 2011/0084386 | A1 * | 4/2011 | Pendse | H10W 74/117 |
| | | | | 257/737 |
| 2015/0145141 | A1 * | 5/2015 | Uzoh | H10W 90/00 |
| | | | | 257/774 |
| 2015/0214182 | A1 * | 7/2015 | Pendse | H10W 74/117 |
| | | | | 257/737 |
| 2015/0294940 | A1 * | 10/2015 | Fay | H10W 70/611 |
| | | | | 257/777 |
| 2015/0380377 | A1 * | 12/2015 | Uzoh | H10W 90/00 |
| | | | | 257/773 |
| 2016/0260646 | A1 * | 9/2016 | Pendse | H10W 74/117 |
| 2019/0103409 | A1 * | 4/2019 | Xu | H03K 19/17736 |
| 2019/0139934 | A1 * | 5/2019 | Ng | H10W 90/00 |
| 2019/0189591 | A1 * | 6/2019 | Zhang | H10W 70/611 |
| 2020/0212010 | A1 * | 7/2020 | Kinsley | H10W 70/611 |
| 2020/0411496 | A1 * | 12/2020 | Zhang | H10W 90/00 |
| 2021/0066247 | A1 * | 3/2021 | Fujisawa | G11C 5/04 |
| 2021/0217737 | A1 * | 7/2021 | Kinsley | H10W 70/611 |
| 2021/0233851 | A1 * | 7/2021 | Chun | H10D 88/101 |
| 2022/0068877 | A1 * | 3/2022 | Tai | H10W 90/00 |
| 2023/0009643 | A1 * | 1/2023 | Paek | H10W 70/65 |
| 2023/0253390 | A1 * | 8/2023 | Sun | H10W 44/501 |
| | | | | 257/659 |
| 2023/0284465 | A1 * | 9/2023 | Castro | H10B 80/00 |
| | | | | 257/774 |
| 2024/0072004 | A1 * | 2/2024 | Kirby | H10D 1/692 |
| 2024/0079369 | A1 * | 3/2024 | McDaniel | H10W 72/0198 |
| 2024/0162207 | A1 * | 5/2024 | Tan | H10W 72/50 |
| 2024/0258243 | A1 * | 8/2024 | Paek | H10W 70/65 |
| 2024/0297149 | A1 * | 9/2024 | Bhushan | H10B 80/00 |
| 2025/0006704 | A1 * | 1/2025 | Zhou | H10B 80/00 |
| 2025/0008750 | A1 * | 1/2025 | Zhou | H10B 80/00 |
| 2025/0070086 | A1 * | 2/2025 | Patil | H10W 90/00 |
| 2025/0140753 | A1 * | 5/2025 | Bhushan | H10W 90/00 |

FOREIGN PATENT DOCUMENTS

| | | | | | |
|---|---|---|---|---|---|
| CN | 112151525 | B | * | 7/2024 | H10W 72/50 |
| CN | 119230514 | A | * | 12/2024 | H10W 90/00 |
| DE | 102024100449 | A1 | * | 11/2024 | H10W 70/635 |
| KR | 100562874 | B1 | * | 3/2006 | H10P 95/00 |
| KR | 20090071767 | A | * | 7/2009 | H10W 74/00 |
| KR | 100967642 | B1 | * | 7/2010 | H10W 74/00 |
| KR | 20160070000 | A | * | 6/2016 | H10F 39/8063 |
| KR | 101782224 | B1 | * | 9/2017 | H01L 23/481 |
| KR | 20240023444 | A | * | 2/2024 | H10W 90/00 |
| KR | 20240124816 | A | * | 8/2024 | H10W 90/00 |
| KR | 102743580 | B1 | * | 12/2024 | H10W 90/701 |
| SG | 135066 | A1 | * | 9/2007 | H10D 64/011 |
| TW | I713161 | B | * | 12/2020 | H10W 90/701 |
| TW | 202220114 | A | * | 5/2022 | H10W 80/00 |
| TW | 202303892 | A | * | 1/2023 | H10W 90/701 |
| WO | WO-2018063188 | A1 | * | 4/2018 | H10W 90/00 |
| WO | WO-2023287482 | A1 | * | 1/2023 | H10W 90/701 |

* cited by examiner

208

204

210

206

202

300

1400

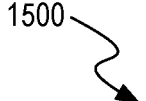

1500

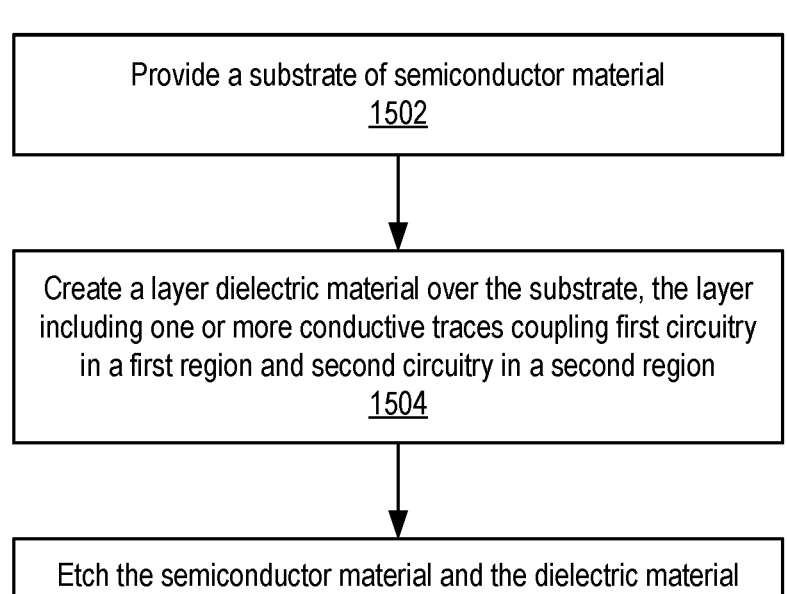

Provide a substrate of semiconductor material
1502

Create a layer dielectric material over the substrate, the layer including one or more conductive traces coupling first circuitry in a first region and second circuitry in a second region
1504

Etch the semiconductor material and the dielectric material between the first region and the second region to separate a first semiconductor die including the first circuitry from a second semiconductor die including the second circuitry
1506

*FIG. 15*

CONNECTING SEMICONDUCTOR DIES THROUGH TRACES

TECHNICAL FIELD

The present disclosure generally relates to semiconductor device assemblies, and more particularly relates to connecting semiconductor dies through traces.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 15 illustrates an example method for fabricating a semiconductor device assembly in accordance with an embodiment of the present technology.

DETAILED DESCRIPTION

Semiconductor devices are integrated in many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without increasing the size of the device. This development, however, may not be sustainable due to various challenges that arise from designing semiconductor device with high circuit density. Thus, additional techniques may be required to continue the growth in capability of semiconductor devices.

One such technique is to implement multiple semiconductor dies within a single package. These multiple dies may be stacked to increase the number of circuit elements within the package without increasing a footprint (e.g., horizontal area) of the device. Stacked semiconductor devices (e.g., three-dimensional interface (3DI) packaging solutions) are often implemented as a set of multiple semiconductor dies disposed on silicon wafers. These dies may physically and electronically connect to one another to secure and communicatively couple the stacked dies. Many solutions for connecting the dies, however, may be prohibitively expensive or difficult to manufacture. One such semiconductor assembly is illustrated by way of example in FIG. 1.

Figure 1:
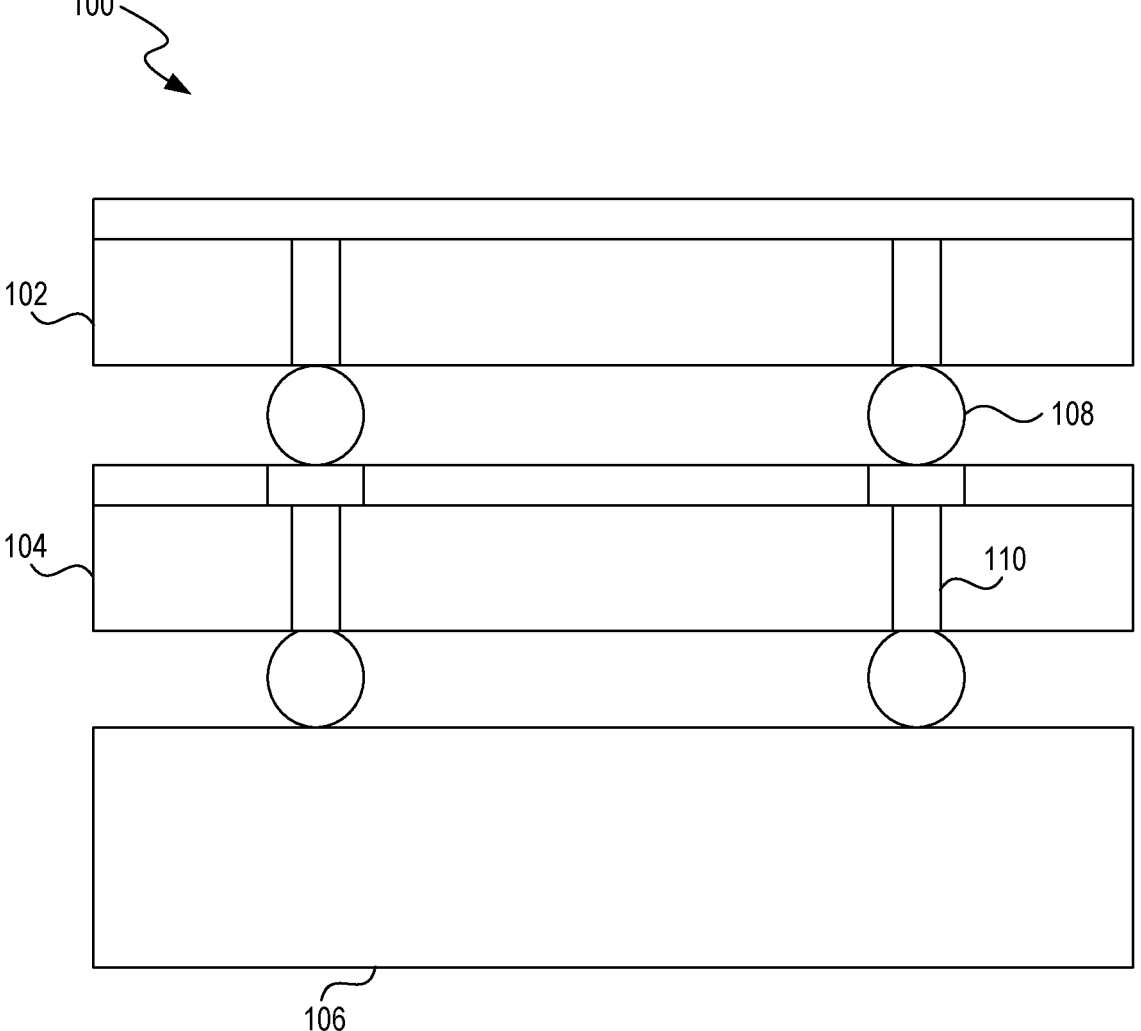
FIG. 1 illustrates a simplified schematic cross-sectional view of an example semiconductor device assembly.

As can be seen with reference to FIG. 1, a semiconductor device assembly 100 includes a semiconductor die 102 and a semiconductor die 104 mounted to a substrate 106. The semiconductor die 102 is mounted on the semiconductor die 104, which is mounted to the substrate 106. The semiconductor die 102 and the semiconductor die 104 may include circuitry (e.g., traces, lines, vias, transistors, etc.) disposed at an active side. The semiconductor die 102, the semiconductor die 104, and the substrate 106 may couple through interconnects 108 (e.g., solder balls, copper pillars, etc.). The semiconductor die 104 or the substrate 106 may include contact pads that couple to traces, lines, vias, or other connective elements. In doing so, the semiconductor die 102 or the semiconductor die 104 may couple to any number of internal or external circuit components to provide functionality (e.g., power, grounding, input/output (I/O) signaling) to the semiconductor device.

The semiconductor die 102 and the semiconductor die 104 may include through-silicon vias (TSVs 110) that couple to circuitry (e.g., traces, lines, vias, or other connective elements) at the active surface. The TSVs 110 may be exposed at the inactive side of the semiconductor dies, and the interconnects 108 may couple the TSVs 110 to the contact pads. In this way, the circuitry at the active surface of the semiconductor dies may be connected to internal or external circuit components to provide functionality to the semiconductor dies. In some instances, the semiconductor dies may be thinned to expose the TSVs 110. This process may cause the semiconductor dies to break, thus causing bottlenecks in the semiconductor device manufacturing process and increasing manufacturing cost.

Moreover, multiple TSVs may be implemented in a semiconductor die to provide adequate connectivity to the die. These TSVs may be surrounded by boundary locations where circuitry may not be disposed due to possible interference from the TSVs. These boundary locations may increase the complexity of circuit design by creating additional obstacles for the circuitry to route around. Thus, semiconductor device designs that rely on multiple TSVs may be difficult to design and limit the allowable circuit density.

To address these drawbacks and others, various embodiments of the present application provide semiconductor assemblies that include multiple semiconductor dies connected through exposed traces. A semiconductor device assembly may include two semiconductor dies. The first semiconductor die includes a first dielectric layer at which first circuitry is disposed. The second semiconductor die includes a second dielectric layer at which second circuitry is disposed. One or more traces extend from a side surface of the first dielectric layer and at a side surface of the second dielectric layer to electrically couple the first circuitry and the second circuitry. In doing so, rigid connective structures may not be needed to couple the first semiconductor die and the second semiconductor die.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a die-level substrate, or another die for die-stacking or 3DI applications.

A person having ordinary skill in the relevant art will recognize that suitable steps of the methods described herein can be performed at the wafer level or at the die level. Thus, although some examples may be illustrated or described with respect to dies or wafer, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
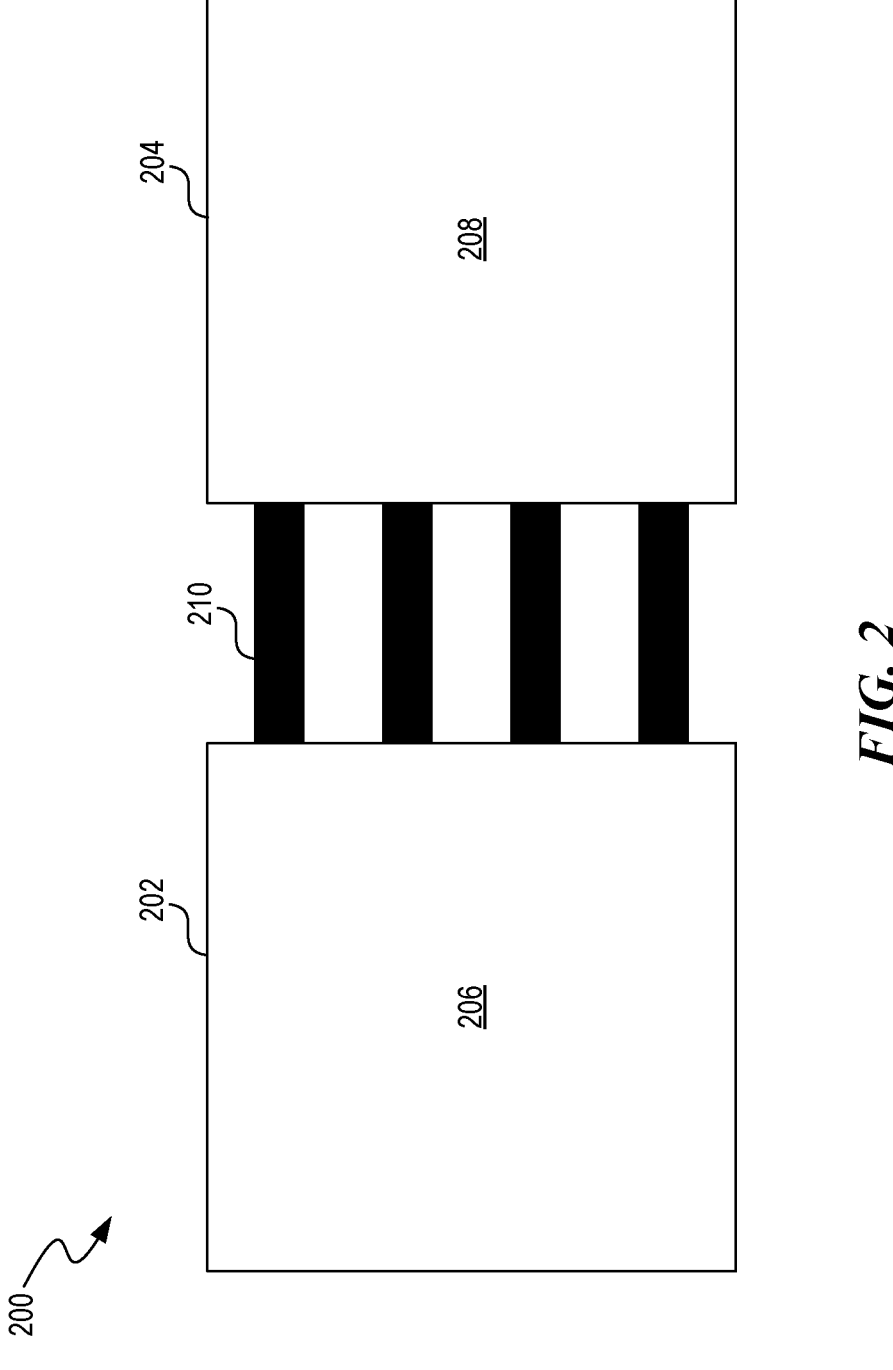
FIG. 2 illustrates a simplified schematic partial plan view of a semiconductor device assembly in accordance with an embodiment of the present technology.

FIG. 2 is a simplified schematic partial plan view of a semiconductor device assembly 200 in accordance with embodiments of the present technology. The semiconductor device assembly 200 includes a semiconductor die 202 and a semiconductor die 204. The semiconductor die 202 may include a dielectric layer 206 implemented at an active side of the semiconductor die 202. The dielectric layer 206 may include circuitry, for example, traces, lines, vias, transistors, or any other circuit elements that may provide functionality or connectivity to the die 202. The dielectric layer 206 may include layers of dielectric material, for example, layers of silicon dioxide, silicon nitride, silicon carbide, silicon carbon nitride, etc. The circuitry may be embedded in the dielectric layer 206 to protect the circuitry from contact, moisture, radiation, or any other disturbance. The semiconductor die 204 may similarly include a dielectric layer 208 at which circuitry and dielectric material is disposed.

The semiconductor die 202 and the semiconductor die 204 or more particularly, the dielectric layer 206 and the dielectric layer 208 may include traces 210 that extend from side surfaces of the dielectric layer 206 and the dielectric layer 208 (e.g., in contrast to the upper surface illustrated in FIG. 2). The side surface of the dielectric layer 206 may be orthogonal to the upper surface of the dielectric layer 206. Similarly, the side surface of the dielectric layer 206 may be orthogonal to an upper surface of the dielectric layer 208. The side surface of the dielectric layer 206 or the dielectric layer 208 may be coplanar with a side surface of the semiconductor die 202 or the semiconductor die 204, respectively. The traces 210 may electrically couple the circuitry at the dielectric layer 206 of the semiconductor die 202 to the dielectric layer 208 of the semiconductor die 204. Although described as traces, the traces 210 may alternatively or additionally be any other electrical connective structure such as a wire or line.

Figure 3:
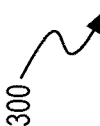
FIG. 3 illustrates a simplified schematic perspective view of a semiconductor device assembly in accordance with an embodiment of the present technology.

FIG. 3 illustrates a simplified schematic perspective view of a semiconductor device assembly 300 in accordance with embodiments of the present technology. The semiconductor die 202 couples to the semiconductor die 204 through the traces 210. The dielectric layer 206 is disposed at an active surface of the semiconductor die 202. The dielectric layer 208 is disposed at an active surface of the semiconductor die 204. For example, the dielectric layer 206 and the dielectric layer 208 may include layers of circuitry and dielectric material deposited in a particular configuration to provide functionality and connectivity to the semiconductor dies.

The circuitry may be embedded in the dielectric layer 206 and the dielectric layer 208. For example, the circuitry may be covered by dielectric material such that the circuitry is not exposed at the upper surface of the dielectric layer 206 or the dielectric layer 208. The traces 210 may extend from any location along the side surface of the dielectric layer 206 and the dielectric layer 208. For example, the dielectric layer 206 or the dielectric layer 208 may include a first interlayer dielectric and a second interlayer dielectric. The traces 210 may include a first portion (hidden in FIG. 3 by the dielectric layer 206 and the dielectric layer 208) that is embedded within the dielectric layer 206 or the dielectric layer 208 between the first and second interlayer dielectric (e.g., in direct contact with the first interlayer dielectric at a top surface and in direct contact with the second interlayer dielectric at a bottom surface). The traces 210 may further include a second portion (visible in FIG. 3) that is external to and extending between the die 202 and the die 204. The second portion of the traces 210 may extend continuously from the first portion of the traces 210 (e.g., the portions being of a same material without interfaces caused by separate deposition processes) through the sidewall of the die 202 and the die 204. In aspects, the traces 210 may extend from the side surface of the dielectric layer 206 or the dielectric layer 208 at a same depth as the circuitry. The circuitry or the traces 210 may be located a distance from an upper surface of the semiconductor die 202 or the semiconductor die 204 (e.g., an upper surface of the dielectric layer 206 or the dielectric layer 208).

The traces 210 may include any number of traces, for example, one, two, three, four, five, ten, one hundred, one thousand, and so on. The traces 210 may be implemented at a same or different location as any of the other traces 210. For example, the traces 210 may be implemented at a same height or at different heights of the dielectric layer 206 or the dielectric layer 208. The traces 210 may be located at a same or different lateral location. In some implementations the traces 210 may be implemented at different lateral locations so that one or more of the traces 210 do not interfere with one another.

In some instances, the semiconductor die 202 or the semiconductor die 204 may be a memory die, for example, a dynamic random-access memory (DRAM) die. The traces 210 may implement one or more buses (e.g., a command and address (CA) bus, a data (DQ) bus, a chip select (CS)) between the memory dies. Thus, the traces 210 may include only a few traces or many traces (e.g., ten, twenty, fifty, one hundred, one thousand, etc.). The traces 210 may additionally or alternatively implement a connection structure capable of providing power or ground signaling to the semiconductor dies. In some instances, the semiconductor die 202 or the semiconductor die 204 may include NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. The semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies could be logic dies (e.g., controller dies, processor dies, etc.), or a mix of logic and memory dies (e.g., a memory controller die and a memory die controlled thereby).

Figure 4:
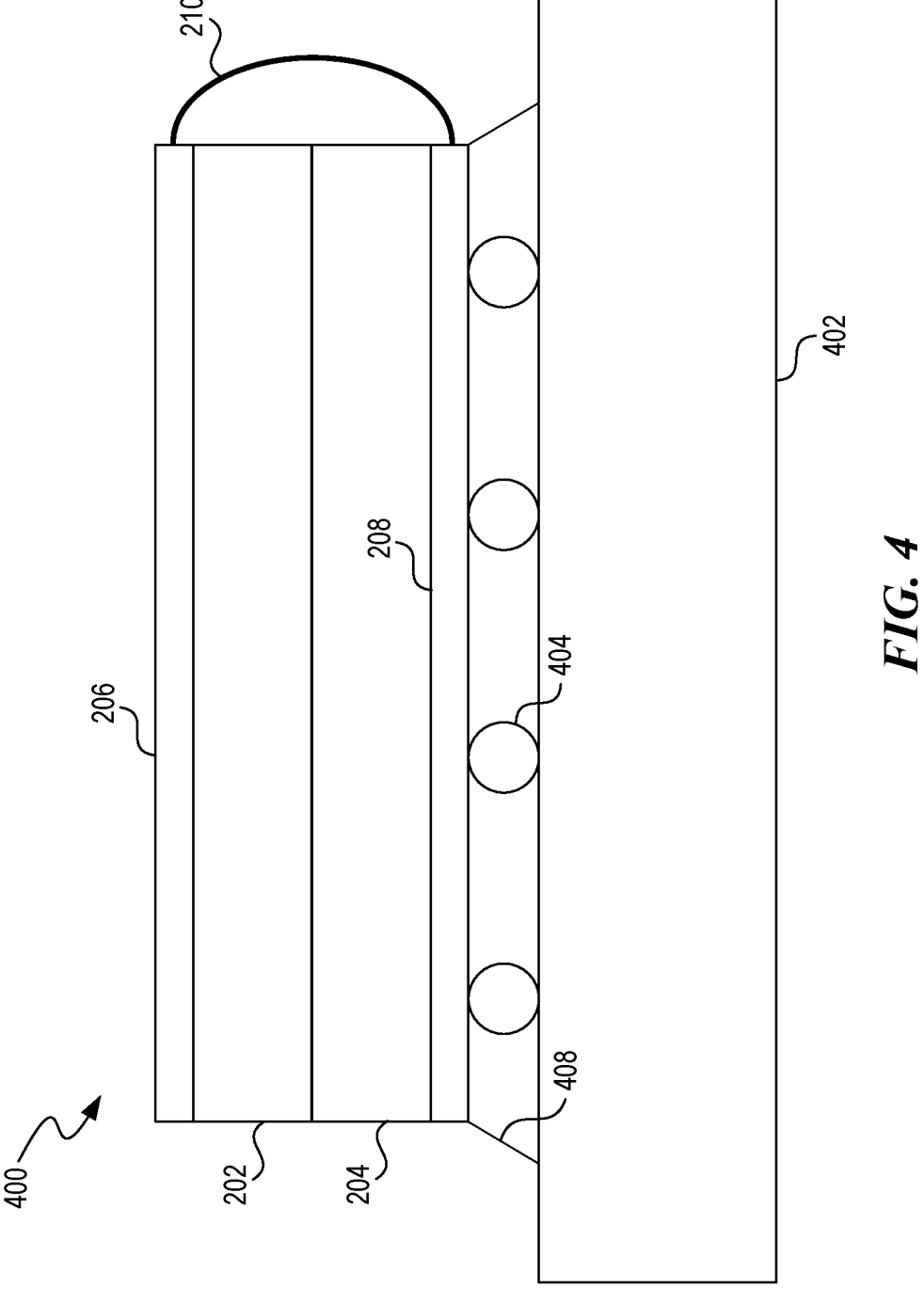
FIG. 4 illustrates a simplified schematic cross-sectional view of a semiconductor device assembly in accordance with an embodiment of the present technology.

FIG. 4 illustrates a simplified schematic cross-sectional view of a semiconductor device assembly 400 in accordance with embodiments of the present technology. The semiconductor device assembly 400 may include the semiconductor die 202 having an inactive side coupled to an inactive side of the semiconductor die 204. The semiconductor die 202 and the semiconductor die 204 may couple through the traces 210 that extend from a side surface of the dielectric layer 206 and a side surface of the dielectric layer 208 to couple circuitry at each of the semiconductor dies. The inactive sides of the semiconductor die 202 and the semiconductor die 204 may couple through an intermediate material (e.g., one or more adhesives) or a direct bond (e.g., a dielectric bond).

The traces 210 may extend from the dielectric layer 206 of the semiconductor die 202 and the dielectric layer 208 of the semiconductor die 204. The traces 210 may be flexible to enable the traces 210 to form an arc between the dielectric layer 206 and the dielectric layer 208. The traces 210 may include a length that enables the traces 210 to extend in an arc along the thickness of the semiconductor die 202 and the thickness of a semiconductor die 204.

The dielectric layer 208 may include contact pads disposed at the active side of the semiconductor die 204 that couple to traces, lines, vias, or other connective elements. The substrate 402 may similarly include contact pads at an upper surface that couple to internal or external circuit components through traces, lines, vias, or other connective elements to provide various functionality to the semiconductor device (e.g., power, grounding, I/O signaling, etc.). Interconnects 404 (e.g., solder balls, copper pillars, etc.) may couple the contact pads at the semiconductor die 204 and the contact pads at the substrate 402 to provide various functionality to the semiconductor dies. An underfill material 408 (e.g., capillary underfill, molded underfill) may be deposited around the interconnects 404 to provide structural support or electrical insulation to the semiconductor device. The underfill material 408 may be deposited through any appropriate technique, for example, a capillary underfill technique or a molded underfill technique.

Figure 5:
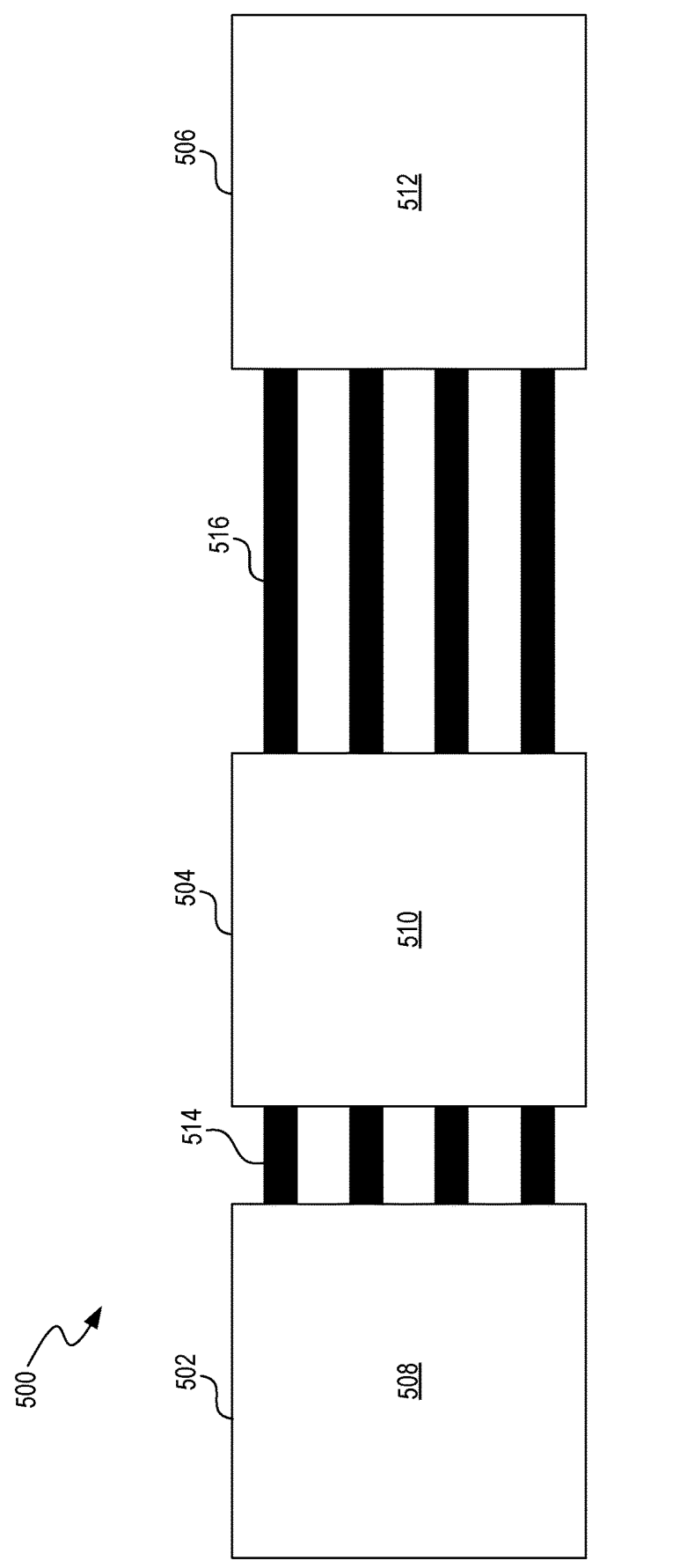
FIG. 5 illustrates a simplified schematic partial plan view of a semiconductor device assembly in accordance with an embodiment of the present technology.

FIG. 5 illustrates a simplified schematic partial plan view of a semiconductor device assembly 500 in accordance with embodiments of the present technology. The semiconductor device assembly 500 includes a semiconductor die 502, a semiconductor die 504, and a semiconductor die 506. The semiconductor die 502, the semiconductor die 504, and the semiconductor die 506 include dielectric layer 508, dielectric layer 510, and dielectric layer 512, respectively. The dielectric layer 508, the dielectric layer 510, and the dielectric layer 512 may include circuitry that couples through the traces 514 and the traces 516. For example, the traces 514 may couple circuitry at the dielectric layer 508 to circuitry at the dielectric layer 510, and traces 516 may couple the circuitry at the dielectric layer 510 to circuitry at the dielectric layer 512.

The traces 514 may be designed to enable the semiconductor die 502 and the semiconductor die 504 to couple at the dielectric layer 508 and the dielectric layer 510. For instance, the traces 514 may have a length that enables the traces 514 to form an arc (e.g. with a first radius of curvature) that spans a portion of the thickness of the dielectric layer 508 and the thickness of the dielectric layer 510. In contrast, the traces 516 may be designed to enable the semiconductor die 504 and the semiconductor die 506 to couple at an inactive side of the semiconductor die 504 and an inactive side of the semiconductor die 506. For instance, the traces 516 may have a length that is greater than the length of the traces 514 to enable the traces 516 to form an arc (e.g., with a second radius of curvature greater than the first radius of curvature) that spans a portion of the thickness of the semiconductor die 504 and the thickness of the semiconductor die 506. In some implementations, the traces 514 and the traces 516 may include a same or different number of traces.

Figure 6:
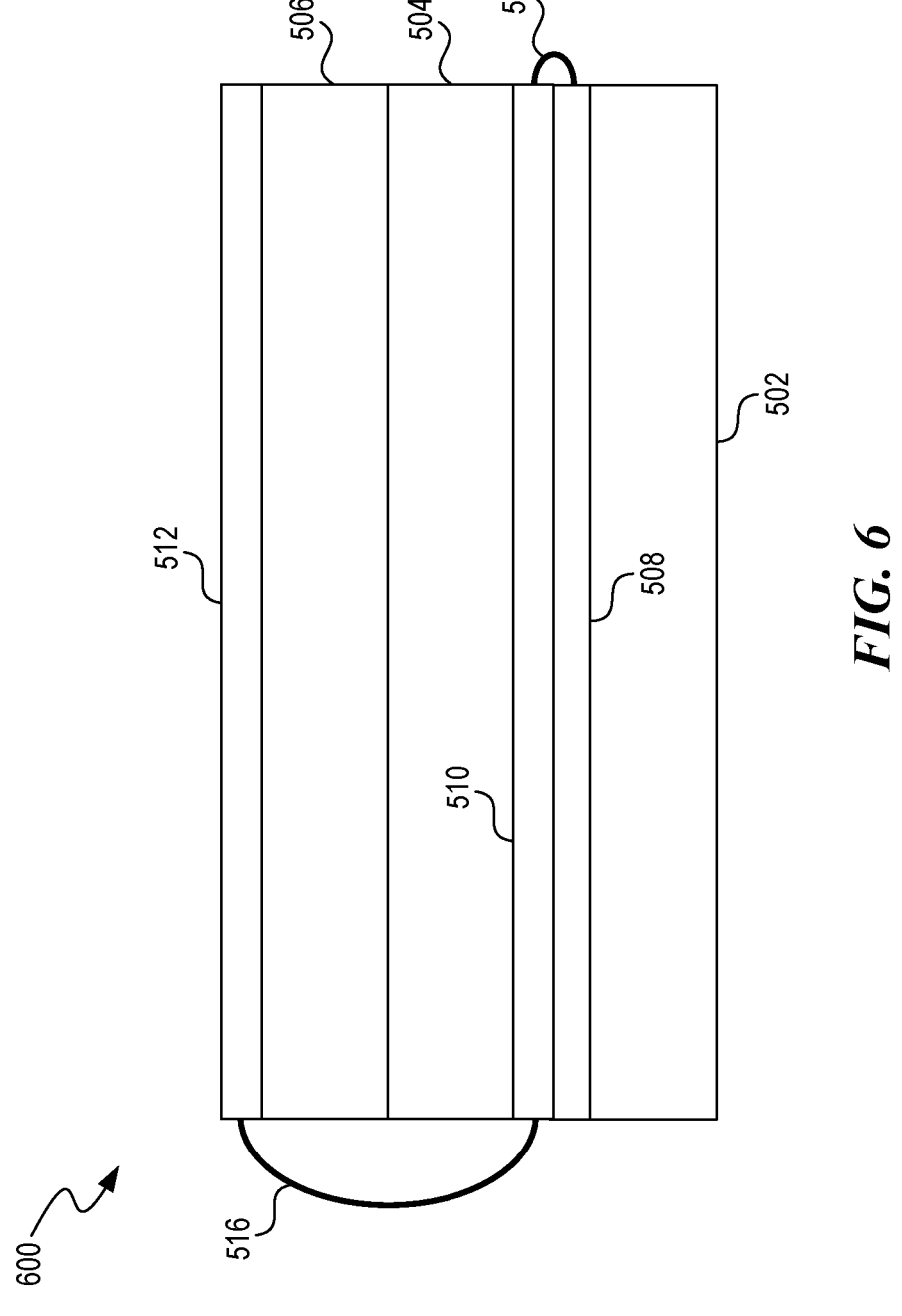
FIG. 6 illustrates a simplified schematic cross-sectional view of a semiconductor device assembly in accordance with an embodiment of the present technology.

FIG. 6 illustrates a simplified schematic cross-sectional view of a semiconductor device assembly 600 in accordance with embodiments of the present technology. The semiconductor device assembly 600 may correspond to a stacked configuration of the die strip illustrated in FIG. 5. The semiconductor device assembly 600 may be stacked such that each die-to-die coupling is an active side-to-active side coupling or an inactive side-to-inactive side coupling.

The semiconductor device assembly 600 includes the semiconductor die 502, the semiconductor die 504, and the semiconductor die 506. The semiconductor die 502 and the semiconductor die 504 may be coupled at the dielectric layer 508 and the dielectric layer 510. The traces 514 may flex to form an arc shape having a first radius of curvature. The traces 514 may couple circuitry at the dielectric layer 508 to circuitry at the dielectric layer 510. The traces 514 may extend from a side surface of the dielectric layer 508 and a side surface of the dielectric layer 510. The semiconductor die 504 may similarly couple with the semiconductor die 506 at an inactive side (e.g., opposite the dielectric layer 510) of the semiconductor die 504 and at an inactive side of the semiconductor die 506 (e.g., opposite the dielectric layer 512). The traces 516 may extend from a side surface of the dielectric layer 510 and a side surface of the dielectric layer 512. The traces 516 flex to form an arc shape having a second radius of curvature that is larger than the first radius of curvature of the traces 514. The traces 516 may couple circuitry at the dielectric layer 510 with circuitry at the dielectric layer 512.

Figure 7:
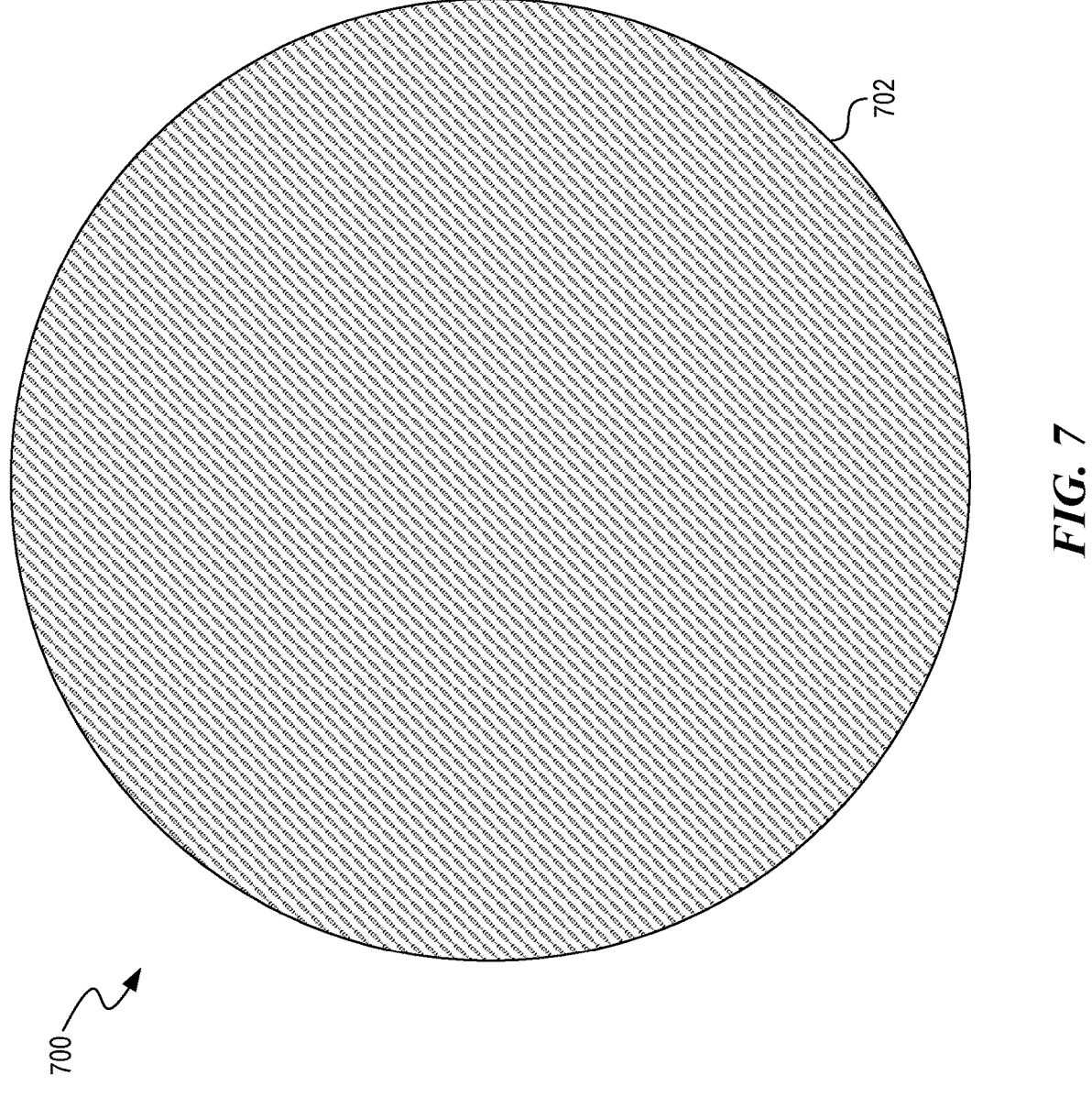
FIGS. 7-13 illustrate simplified schematic partial plan views and simplified schematic cross-sectional views of semiconductor device assemblies through a series of fabrication steps in accordance with an embodiment of the present technology.

FIGS. 7 through 13 illustrate simplified schematic cross-sectional views of a semiconductor device assembly at selected stages in a manufacturing method in accordance with an embodiment of the present technology. As illustrated in FIG. 7, the method can include a stage 700 for providing a substrate 702. The substrate 702 may be any substrate that may be used to manufacture multiple memory dies (e.g., at least two memory dies), for example, a semiconductor wafer. The substrate 702 may have any size, for example, 100, 150, 200, 300, 450 millimeters, etc. The substrate 702 may be composed of any semiconductor material, such as silicon, germanium, silicon-germanium alloy, gallium arsenide, gallium nitride, etc.

Figure 8:
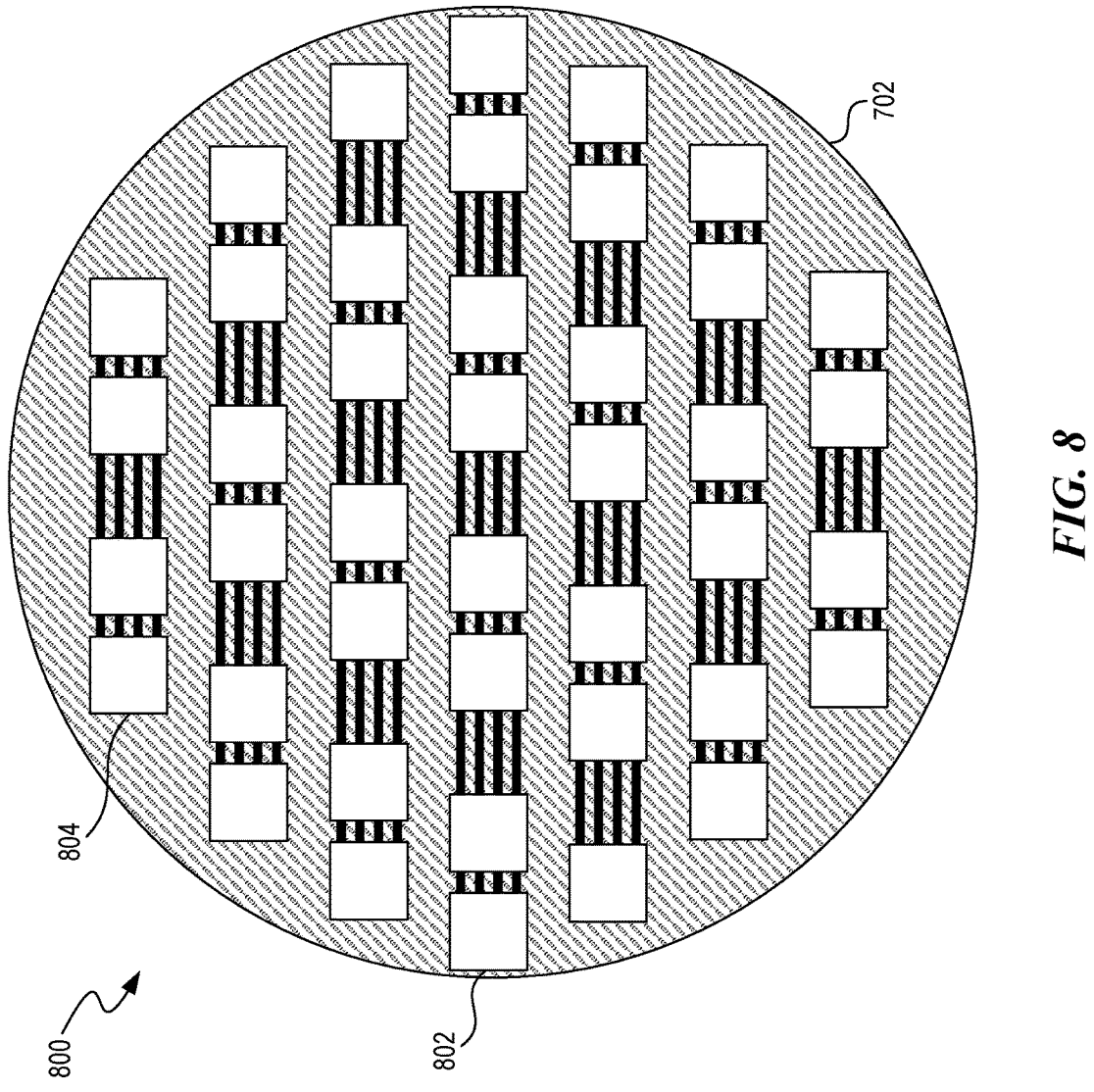

As illustrated in FIG. 8, the method can include a stage 800 for creating a dielectric layer at an upper surface of the substrate 702. The dielectric layer can include layers of dielectric material and layers of conductive material to create circuitry and connective elements at the dielectric layer. The dielectric material or the conductive material may be deposited at the substrate 702 through any appropriate technique, for example, chemical vapor deposition, physical vapor deposition, atomic layer deposition, spin coating, or oxidation. Similarly, the substrate 702 or the dielectric layer may be etched to create the circuitry and the connective elements. For example, the substrate 702 or the dielectric layer may be etched through plasma etching, wet etching, chemical-mechanical planarization, or other suitable techniques.

The dielectric layer may be created such that one or more die strips may be implemented at the substrate 702. For example, the die strip 802 and the dies die strip 804 may be implemented at the substrate 702. Each die strip may include multiple dies, each containing circuitry, and connective elements between the dies (e.g., traces, lines, vias, etc.). The number of dies in each die strip may vary based on the location of the die strip on the substrate 702. For example, the die strip 802 may include eight dies connected through traces, and the die strip 804 may include four dies connected through traces. The traces and the die circuitry may be embedded in the dielectric layer when they are initially manufactured. Each die on the strip may be spaced such that the dies may be stacked in an active side-to-active side and inactive side-to-inactive side configuration. The dies may be spaced such that traces connecting the dies are of adequate length to create the arc shaped interconnect between the stacked dies. For example, the first die and the second die may be spaced by a first length appropriate to create traces that can form an arc connecting two dies connected at the active side, and the second die and the third die may be spaced by a second length (e.g., greater than the first length) appropriate to create traces that can form an arc connecting two dies connected at the inactive side. This pattern may continue each of the dies in the die strip.

Figure 9:
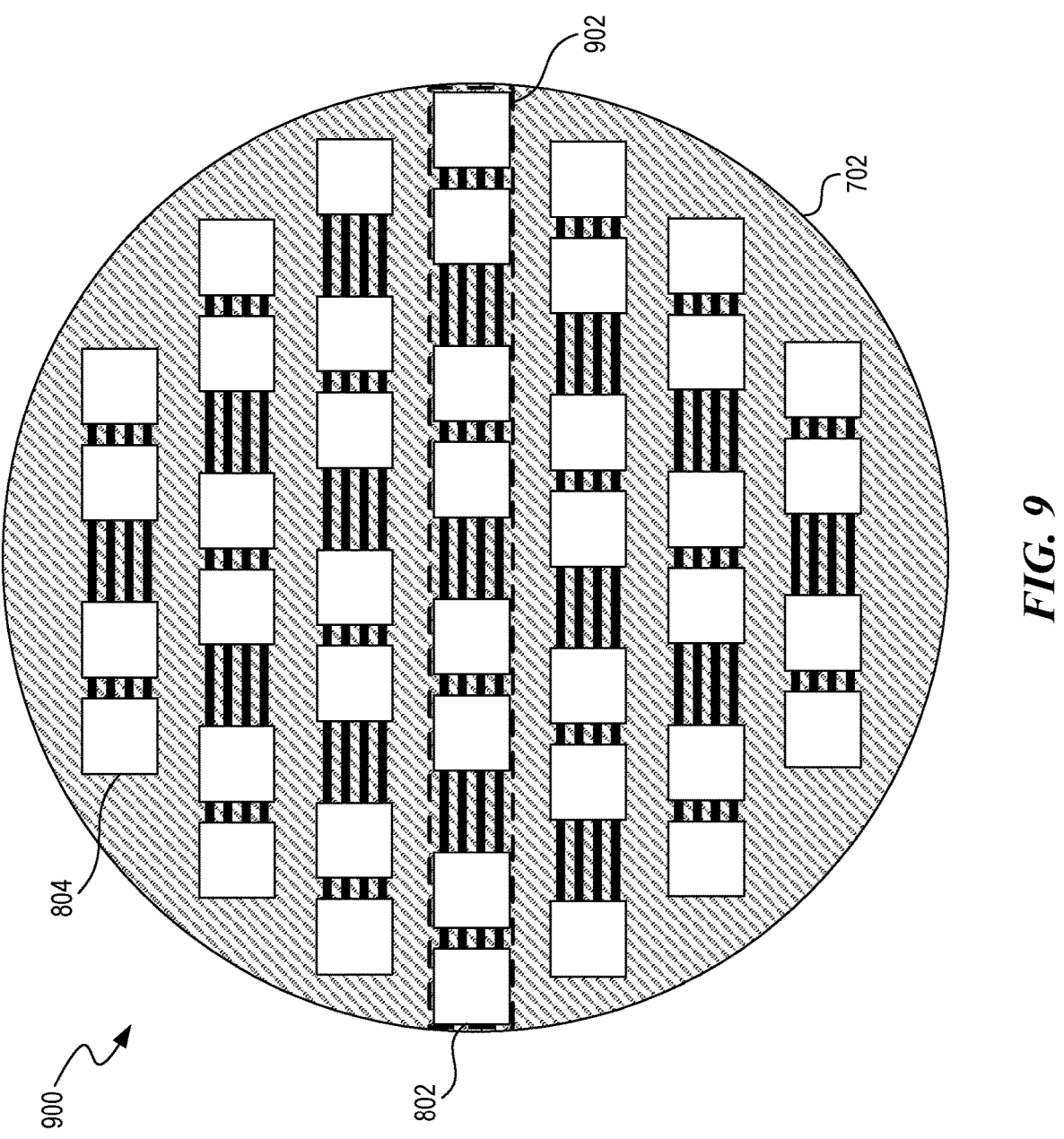

As illustrated in FIG. 9, the method can include a stage 900 for dicing the substrate 702. The substrate 702 may be diced along cut lines 902 to separate the die strip 802 from the rest of the substrate 702. The dicing may include scribing and breaking the substrate 702 or using a dicing saw to cut the substrate 702 along the cut lines 902. The substrate 702 may be diced around each die strip to create individual die strips, for example, the die strip 802 and the die strip 804.

Figure 10:
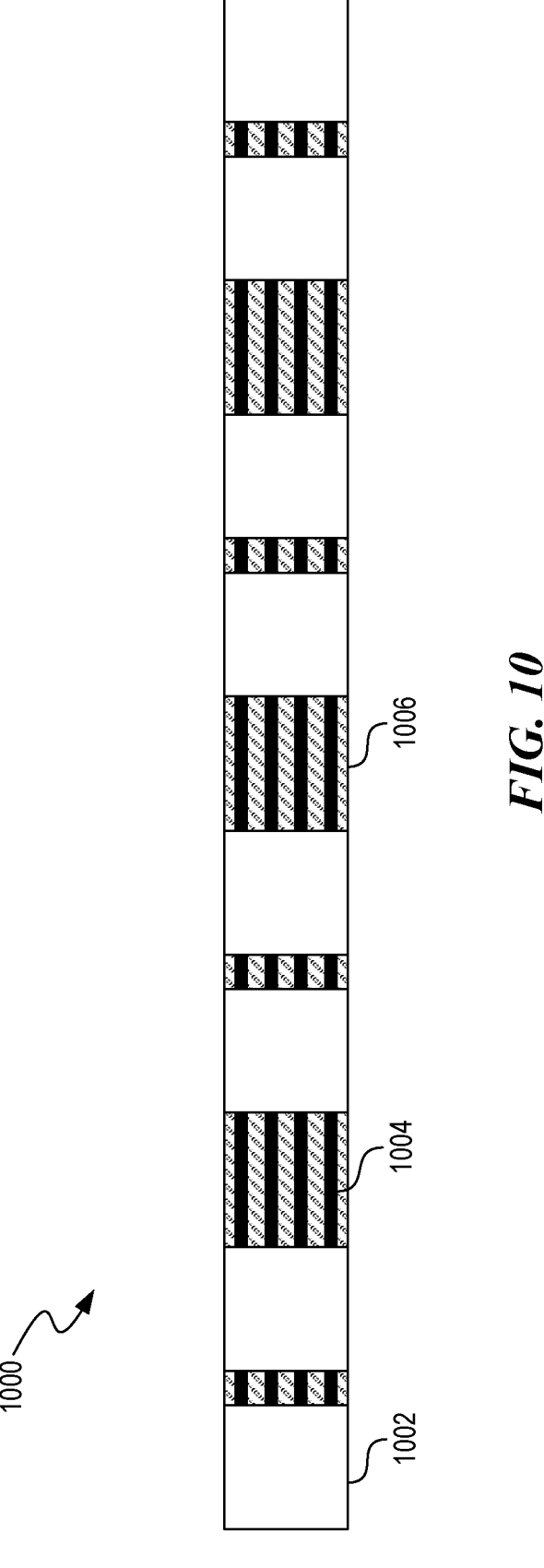

As illustrated in FIG. 10, the method can include a stage 1000 for providing a die strip. The die strip may include a plurality of semiconductor dies 1002 connected through traces 1004. The semiconductor dies 1002 may include circuitry disposed at a dielectric layer of the semiconductor dies 1002. The traces 1004 may couple directly to the circuitry at the dies to electrically couple the semiconductor dies 1002. After the substrate is diced, substrate material 1006 may still be located between the traces 1004. The substrate material 1006 may include the initial substrate or dielectric material deposited around the traces 1006.

Figure 11:
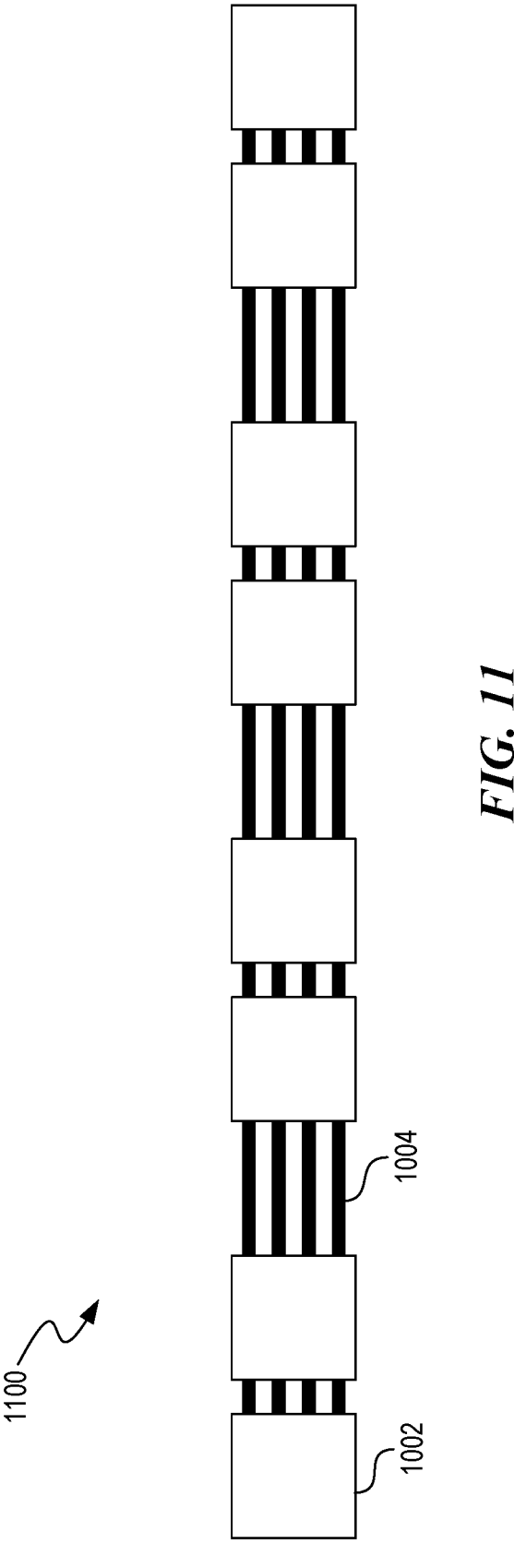

As illustrated in FIG. 11, the method can include a stage 1100 of etching the substrate to expose the traces 1004. For example, the etching may remove the substrate material from between the traces 1004. The etching may include removing the substrate that the traces 1004 are deposited on, removing the substrate between the traces 1004, or removing the dielectric material deposited around the traces 1004. The etching may be performed through any appropriate technique, for example, plasma etching, wet etching, chemical-mechanical planarization, or other suitable techniques. In some implementations, photolithography may be used to remove the substrate material. Once etched, the traces 1004 may be free-standing traces (e.g., not supported by a substrate) that may flex to form arc shaped interconnects when the semiconductor dies 1002 are stacked. The circuitry at each of the semiconductor dies 1002 may remain embedded in the dielectric layer even after the etching has finished. The traces 1004 may couple to the circuitry at the semiconductor dies 1002 and extend from a side surface of the semiconductor dies 1002 (e.g., a distance below the upper surface of the semiconductor dies 1002).

Figure 12:
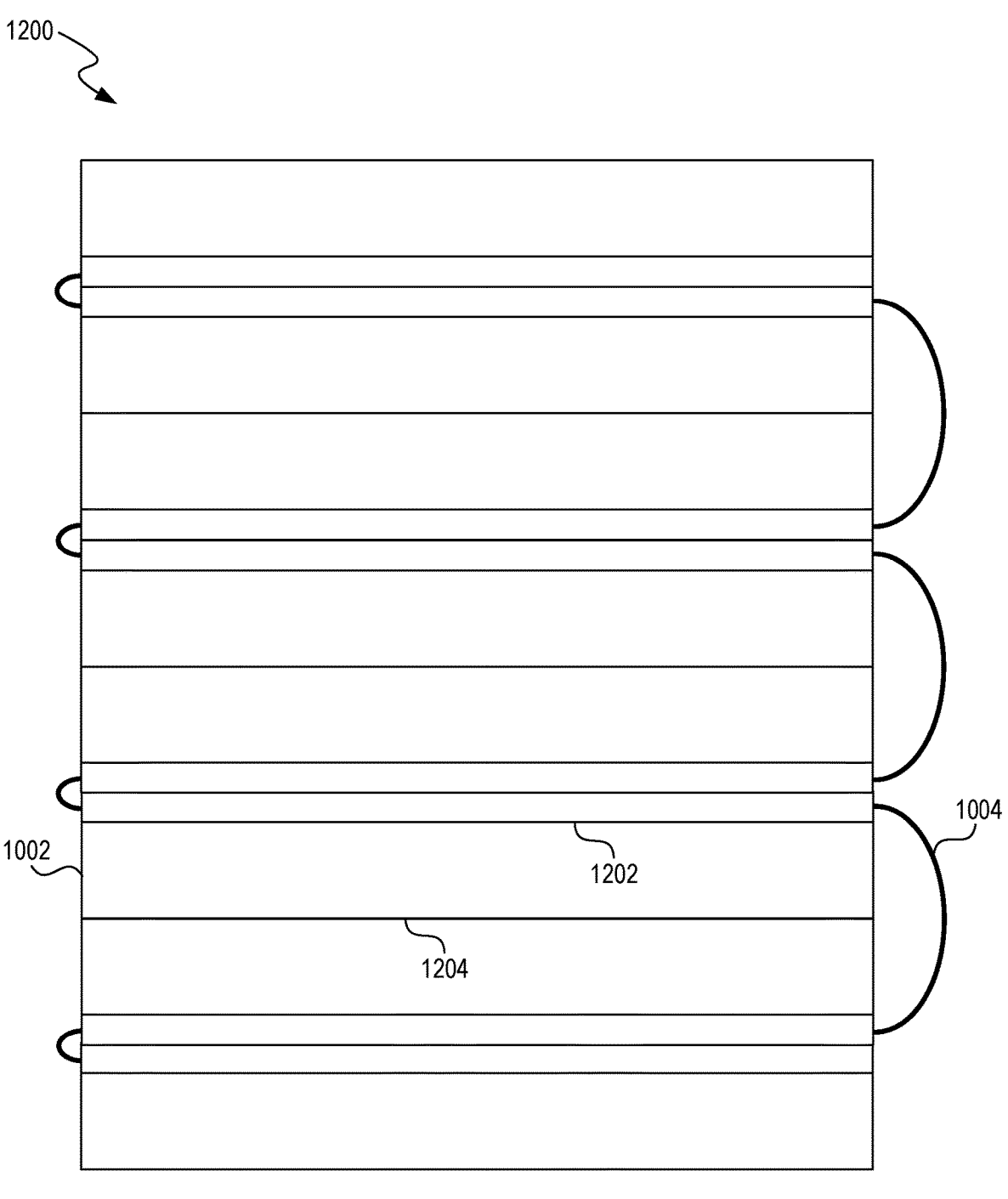

As illustrated in FIG. 12, the method can include a stage 1200 for assembling the semiconductor dies 1002 as a die stack. The die semiconductor die stack may include internal coupling between each set of two of the semiconductor dies 1002. Each of the semiconductor dies may include an active side 1202 at which circuitry (e.g., at a dielectric layer) is disposed and an inactive side 1204 opposite the active side 1202. Each internal coupling between each set of two of the semiconductor dies 1002 may be coupled active side 1202 to active side 1202 or inactive side 1204 to inactive side 1204. The semiconductor dies 1002 may couple through an intermediate material or through direct bonding. The bonding process may include creating a vacuum condition, exposing the semiconductor dies 1002 to an inert gas, heating the semiconductor dies 1002, applying pressure to the semiconductor dies 1002, or any other operation.

The die stack may be assembled such that the side surface of each of the semiconductor dies 1002 aligns (e.g., the semiconductor dies 1002 are not staggered). The traces 1004 may extend from a side surface of a lower semiconductor die (e.g., at the dielectric layer) and a side surface of an upper semiconductor die (e.g., at the dielectric layer). The traces 1004 may electrically couple any of the semiconductor dies 1002, directly or indirectly, to any other semiconductor die of the semiconductor dies 1002. The die stack may include any number of semiconductor dies 1002, for example, eight as illustrated.

Figure 13:
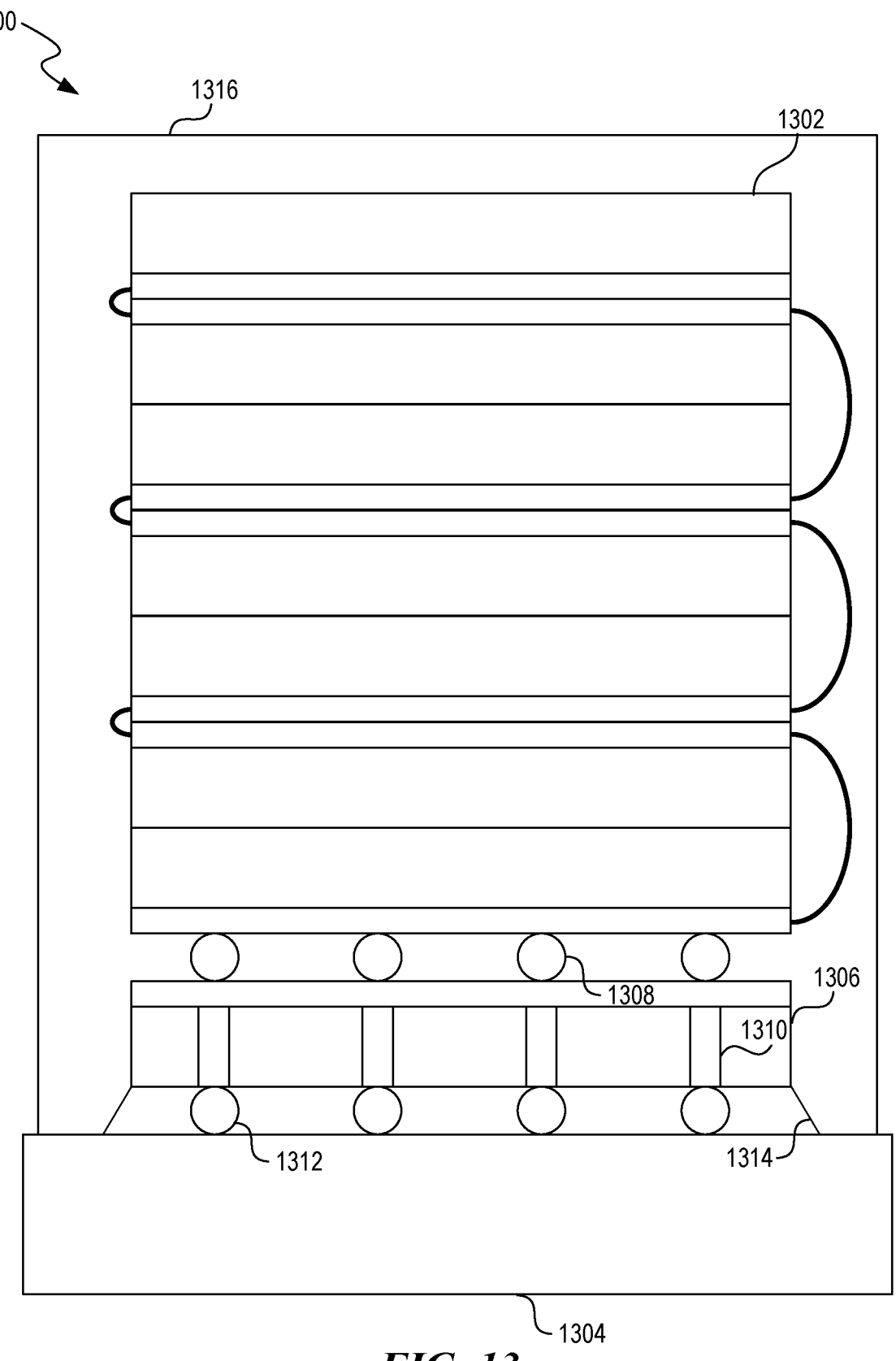

As illustrated in FIG. 13, the method can include a stage 1300 for packaging the semiconductor device 1302 and assembling the semiconductor device 1302 on a package-level substrate 1304. In some implementations, the substrate 1304 may include a printed circuit board (PCB) that attached to the semiconductor device 1302 and one or more other components of a system in which the semiconductor device 1302 is implemented. The semiconductor device 1302 may couple to the substrate 1404 though an intermediate die 1306, for example, an interface die, and interposer, or a control die. The semiconductor device 1302 may couple to the intermediate die 1306 through one or more interconnects 1308. The interconnects 1308 may include solder balls, copper pillars, or other conductive structures that can electrically or mechanically couple the semiconductor device 1302 to the intermediate die 1306. The intermediate die 1306 of the may include TSVs 1310 at a coupling surface between the intermediate die 1306 and the substrate 1304.

The intermediate die 1306 may couple to the substrate 1304 through one or more interconnects 1312 at the exposed TSVs 1310. The TSVs 1310 may couple to one or more internal or external circuit components (e.g., traces, lines, vias, etc.) to adequately connect the semiconductor device 1302. The substrate 1304 may similarly include contact pads coupled to internal or external circuit components through connective circuitry internal or external to the substrate 1304. The interconnects 1312 may couple the TSVs 1310 or at the intermediate die 1306 to the contact pads at the substrate 1304, and the interconnects 1308 may couple the intermediate die 1306 to the semiconductor device 1302. In this way, any of the semiconductor dies may electrically couple to the substrate 1304.

An underfill material 1314 may be disposed between the intermediate die 1306 and the substrate 1304 around the interconnects 1312. The underfill material 1314 may structurally support the assembly of the semiconductor device 1302 or the intermediate die 1306 on the substrate 1304. Moreover, the underfill material 1314 may electrically insulate the interconnects 1312. The semiconductor device 1302 may be at least partially encapsulated by an encapsulant 1316 to protect the semiconductor device from environmental factors (e.g., moisture, particulates, static electricity, and physical impact). The underfill material 1314 and the encapsulant 1316 may be provided in separate processes (e.g., a capillary underfill process and an encapsulation process) or in a same process (e.g., molded underfill process).

In accordance with one aspect of the present disclosure, the semiconductor devices illustrated in the assemblies of FIGS. 2-13 could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 14:
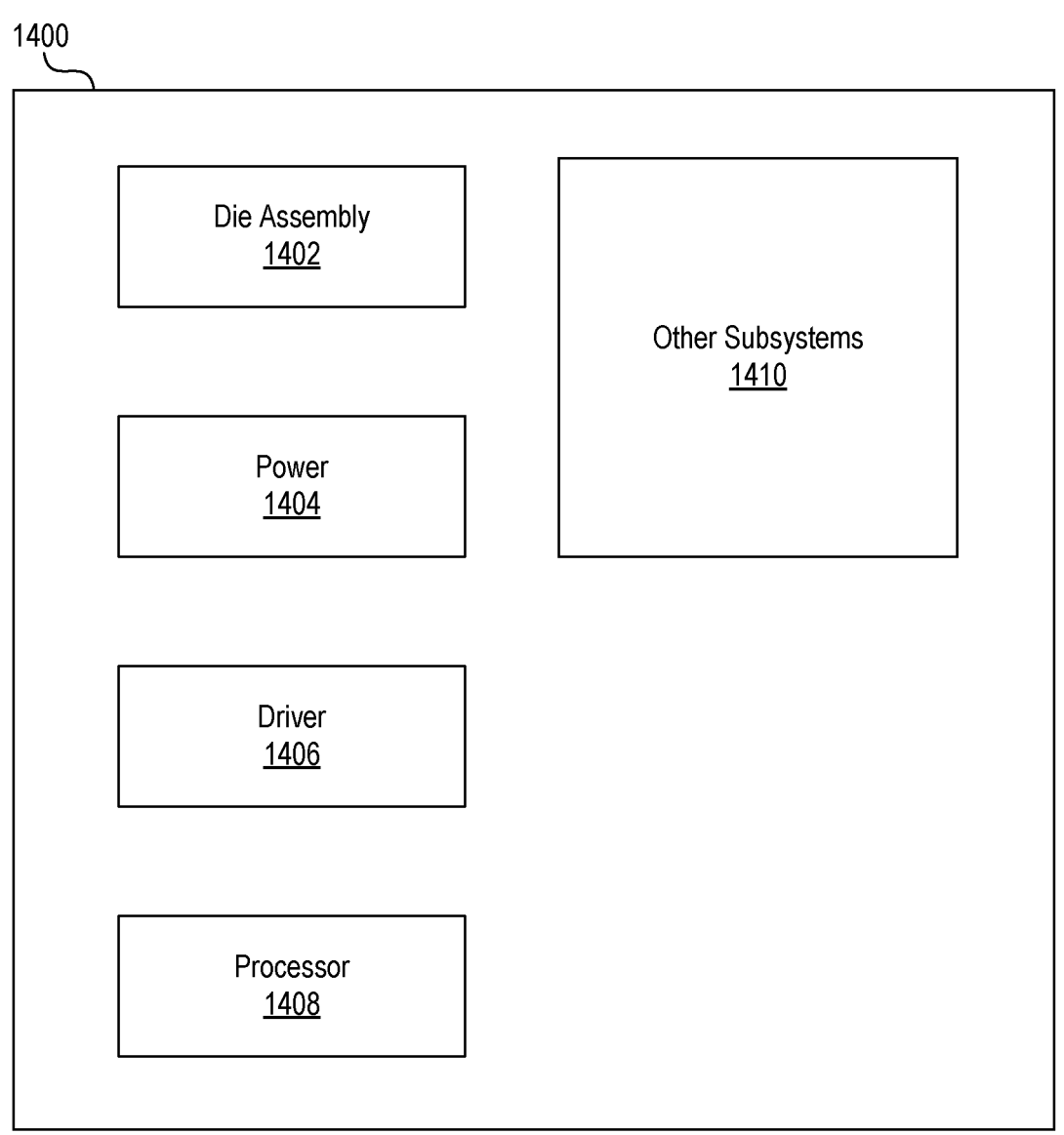
FIG. 14 illustrates a schematic view showing a system that includes a semiconductor device assembly configured in accordance with an embodiment of the present technology.

Any one of the semiconductor devices and semiconductor device assemblies described above with reference to FIGS. 2-13 can be incorporated into any of a myriad of larger and/or more complex systems, a representative example of which is system 1400 shown schematically in FIG. 14. The system 1400 can include a semiconductor device assembly 1402 (e.g., or a discrete semiconductor device), a power source 1404, a driver 1406, a processor 1408, and/or other subsystems or components 1410. The semiconductor device assembly 1402 can include features generally similar to those of the semiconductor devices described above with reference to FIGS. 2-13. The resulting system 1400 can perform any of a wide variety of functions, such as memory storage, data processing, and/or other suitable functions. Accordingly, representative systems 1400 can include, without limitation, hand-held devices (e.g., mobile phones, tablets, digital readers, and digital audio players), computers, vehicles, appliances and other products. Components of the system 1400 may be housed in a single unit or distributed over multiple, interconnected units (e.g., through a communications network). The components of the system 1400 can also include remote devices and any of a wide variety of computer-readable media.

FIG. 15 illustrates an example method 1500 for fabricating a semiconductor device assembly in accordance with an embodiment of the present technology. The method 1500 may, for illustrative purposes, be described with respect to features, components, or elements of FIGS. 2-14. Although illustrated in a particular configuration, one or more operations of the method 1500 may be omitted, repeated, or reorganized. Additionally, the method 1500 may include other operations not illustrated in FIG. 15, for example, operations detailed in one or more other method described herein.

At 1502, a substrate 702 of semiconductor material is provided. At 1504, a layer of dielectric material is created at the substrate 702. The layer of dielectric material may include one or more traces coupling first circuitry at a first portion and second circuitry at a second portion. The layer of dielectric material may additionally include one or more additional traces coupling the second circuitry at the second portion to third circuitry at a third portion. The substrate 702 may be created such that the first circuitry and the second circuitry are spaced by an amount that enables the traces to have a first length. Similarly, the second circuitry and the third circuitry may be spaced such that the one or more additional traces have a second length greater than the first length of the one or more traces.

At 1506, the semiconductor material and the dielectric material may be etched to separate a first semiconductor die including the first circuitry from a second semiconductor die including the second circuitry. The substrate 702 may be diced to create a die strip 802 having a plurality of semiconductor dies 1002 and traces 1004 coupling the plurality of semiconductor dies 1002. Multiple dies strips may be created from a single substrate, each having a different number of semiconductor dies 1002. For example, the substrate 802 may be designed such that a minimal amount of substrate space is wasted during production of the die strips.

The semiconductor material and the dielectric material may be etched to leave the one or more traces 1004. The semiconductor material and the dielectric material may similarly be etched to leave the one or more additional traces. The semiconductor material and the dielectric material may be etched through any appropriate technique, including plasma etching, wet etching, or chemical mechanical planarization. In some implementations, photolithography may be used to remove the semiconductor material or the dielectric material from between the traces 1004. Once the traces 1004 are exposed through etching, the traces 1004 may be a flexible, free-standing connective element.

In aspects, the method 1500 may further include mounting the semiconductor dies 1002 to one another. For example, the semiconductor die may be mounted to the first semiconductor die such that the one or more traces coupling the semiconductor dies form an arc shape. The semiconductor dies 1002 may be mounted at the active sides or at the inactive sides. The semiconductor dies 1002 may be mounted in an active side-to-active side and inactive side-to-inactive side configuration. In doing so, a rigid connective structure may not be needed to connect one semiconductor die to another. Moreover, the need for TSVs may be eliminated. As a result, performing the method 1500 may enable a reliable and efficient semiconductor device to be assembled.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a first semiconductor die including a first layer of a dielectric material at which first circuitry is disposed, the first layer having a first upper surface;
a second semiconductor die including a second layer of the dielectric material at which second circuitry is disposed, the second layer having a second upper surface; and
one or more traces extending from a first side surface of the first layer and a second side surface of the second layer, the one or more traces directly coupling the first circuitry and the second circuitry, wherein the first side surface is orthogonal to the first upper surface, and wherein the second side surface is orthogonal to the second upper surface.

2. The semiconductor device assembly of claim 1, wherein the one or more traces are not surrounded by the dielectric material.

3. The semiconductor device assembly of claim 1, wherein the second semiconductor die is mounted on the first semiconductor die such that the one or more traces form an arc.

4. The semiconductor device assembly of claim 1, further comprising:
a third semiconductor die including a third layer of the dielectric material at which third circuitry is disposed; and
one or more additional traces extending from a third side surface of the second layer and a fourth side surface of the third layer, the one or more additional traces directly coupling the second circuitry and the third circuitry.

5. The semiconductor device assembly of claim 4, wherein:
the one or more traces have a first length; and
the one or more additional traces have a second length that is greater than the first length.

6. The semiconductor device assembly of claim 1, wherein the one or more traces extend from a first position on the first side surface a from non-zero distance from the first upper surface of the first layer, and extend from a second position on the second upper surface a second non-zero distance from the second upper surface of the second layer.

7. The semiconductor device assembly of claim 1, wherein:
the first circuitry is embedded in the first layer; and
the second circuitry is embedded in the second layer.

8. A semiconductor device assembly, comprising:
a first semiconductor die including a first active side at which first circuitry is disposed and a first inactive side opposite the first active side;
a second semiconductor die including a second active side at which second circuitry is disposed and a second inactive side opposite the second active side; and
a third semiconductor die including a third active side at which third circuitry is disposed and a third inactive side opposite the third active side,
wherein the first active side is physically coupled to the second active side and the second inactive side is physically coupled to the third inactive side,
wherein the first circuitry is electrically coupled to the second circuitry via one or more traces extending between a first sidewall of the first semiconductor die at the first active side and a second sidewall of the second semiconductor die at the second active side,
wherein the first sidewall is orthogonal to a first plane of the first active side, and wherein the second sidewall is orthogonal to a second plane of the second active side, and
wherein the first circuitry, the second circuitry, and the third circuitry are electrically coupled exclusive of any through-silicon vias (TSV).

9. The semiconductor device assembly of claim 8 wherein the one or more traces are one or more first traces, and wherein the semiconductor device assembly further comprises:
one or more second traces coupling the second circuitry and the third circuitry.

10. The semiconductor device assembly of claim 9, wherein:
the one or more second traces extend between the second sidewall of the second semiconductor die at the second active side and a third sidewall of the third semiconductor die at the third active side to electrically couple the second circuitry and the third circuitry.

11. The semiconductor device assembly of claim 10, wherein:

the one or more traces extend between the first sidewall and the second sidewall such that the one or more traces are configured in a first arc shape having a first radius of curvature; and the one or more second traces extend between the second sidewall and the third sidewall such that the one or more second traces are configured in a second arc shape having a second radius of curvature greater than the first radius of curvature.

12. The semiconductor device assembly of claim 9, wherein:

the one or more first traces have a first length; and the one or more second traces have a second length greater than the first length.

13. The semiconductor device assembly of claim 8, further comprising an encapsulant that at least partially encapsulates the first semiconductor die, the second semiconductor die, and the third semiconductor die.

14. The semiconductor device assembly of claim 8, wherein the third semiconductor die further includes one or more contact pads coupled to the third circuitry and disposed at the third active side, the semiconductor device assembly further comprising:

a substrate coupled to the one or more contact pads at the third active side effective to electrically couple the substrate to the first circuitry, the second circuitry, and the third circuitry.

* * * * *